US006897121B2

United States Patent
Lee et al.

(10) Patent No.: US 6,897,121 B2
(45) Date of Patent: May 24, 2005

(54) METHOD OF REMOVING HDP OXIDE DEPOSITION

(75) Inventors: H. Wally Lee, Feng-Shan (TW); Ching-Ping Wu, Taipei (TW); Han-Maou Chang, Taipei (TW); Ma Chia-Chih, Hsinchu (TW); Nan-Tzu Lian, Hsinchu (TW); Hsin-Cheng Liu, Hsinchu (TW)

(73) Assignee: Macronix International Co., Ltd. (TW)

( * ) Notice: Subject to any disclaimer, the term of this patent is extended or adjusted under 35 U.S.C. 154(b) by 317 days.

(21) Appl. No.: 10/442,266

(22) Filed: May 21, 2003

(65) Prior Publication Data
US 2004/0023501 A1 Feb. 5, 2004

(30) Foreign Application Priority Data
Aug. 5, 2002 (TW) .......................................... 91117580

(51) Int. Cl.⁷ ............................................... H01L 21/76
(52) U.S. Cl. ........................ 438/424; 438/443; 438/697
(58) Field of Search ................................ 438/424, 443, 438/697, 700, 787

(56) References Cited

U.S. PATENT DOCUMENTS

| | | | | |
|---|---|---|---|---|
| 5,883,004 A | * | 3/1999 | Shiu et al. | 438/692 |
| 5,923,993 A | * | 7/1999 | Sahota | 438/427 |
| 6,242,322 B1 | * | 6/2001 | Chen et al. | 438/424 |
| 6,503,804 B2 | * | 1/2003 | Nagai | 438/296 |
| 6,541,349 B2 | * | 4/2003 | Arthanari et al. | 438/424 |
| 6,593,241 B1 | * | 7/2003 | Abraham et al. | 438/697 |

* cited by examiner

Primary Examiner—Erik J. Kielin
Assistant Examiner—David S Blum
(74) Attorney, Agent, or Firm—Rabin & Berdo, PC

(57) ABSTRACT

A method of removing HDP oxide deposition comprises the steps of: (1) etching the HDP oxide deposition by in-side-out model, wherein the etching rate in the center of the substrate is faster than the edges of the substrate; (2) etching the HDP oxide deposition by out-side-in model, wherein the etching rate in the edges of the substrate is faster than the center of the substrate; and (3) removing the remaining silicon oxide layer using chemical-mechanical polishing (CMP). According to the method of the invention, the HDP oxide deposition can be planarized more uniform.

8 Claims, 4 Drawing Sheets

METHOD OF REMOVING HDP OXIDE DEPOSITION

This application claims the benefit of Taiwan application Serial No. 091117580, filed on Aug. 5, 2002.

BACKGROUND OF THE INVENTION

1. Field of the Invention

The invention relates in general to a method of removing the HDP oxide deposition, and more particularly to the method of using two-step etching to remove the HDP oxide deposition.

2. Description of the Related Art

In the fabrication of very large scale integration (VLSI), chemical-mechanical polishing (CMP) is the typical technique that provides global planarization. Since the feature size of the semiconductor device is greatly reduced, the manufactures depend on the technique for planarization process. An etch back process is also performed before CMP in order to obtain a better uniformity.

For the semiconductor device with small dimension, such as a line width of 0.25 $\mu$m or even 0.18 $\mu$m, it is very important to planarize the wafer surface, especially to planarize the oxide layer within in a trench. For example, the top oxide layer (composed of silicon oxide) above the silicon nitride (SIN) layer has to be planarized by CMP, so that the trench filled with the silicon oxide is coplanar with the SIN layer. However, there is an problem for an HDP oxide layer, which the silicon oxide layer formed by high-density plasma (HDP) method is too thick to be completely polished by CMP.

A conventional process of forming a shallow trench isolation (STI) is taken for illustration. FIG. 1A~FIG. 1C depict the cross-sectional view of a conventional process for forming a shallow trench isolation by chemical-mechanical polishing (CMP). In FIG. 1A, a bottom oxide layer 102 and a silicon nitride (SIN) layer 104 are formed on the substrate 100. Then, the shallow trench 106 is formed by photolithography. In FIG. 1B, a HDP oxide layer 108, the silicon oxide (SIO2) deposited by using high-density plasma (HDP) method, is formed over the SIN layer 104 and fills the shallow trench 106. The characteristic of the HDP oxide layer is that the oxide film is about 8 K (8000 Å) thick and the surface of the deposited film is undulating. If the HDP oxide layer 108 is directly polished by the CMP method for remove, some of the HDP oxide is still remained on the SIN layer 104, as shown in FIG. 1C. Those HDP oxide residues denoted as 108a will cause the serious problem in the post manufacturing process.

For solving the over-thick problem of HDP oxide layer, an etching back process is also applied before the CMP method. FIG. 2A~FIG. 2D depict the cross-sectional view of another conventional process for forming a shallow trench isolation. In FIG. 2A and FIG. 2B, the bottom oxide layer 202 and a SIN layer 204 are formed on the substrate 200. Also, the shallow trench 206 is formed by photolithography. Then, the HDP oxide layer 208 is formed on the SIN layer 204 and fills the shallow trench 206. A photo-resist (PR) is coated on the HDP oxide layer 208 and patterned to be a PR mask 210 using photolithography, as shown in FIG. 2C. Then, the exposed part of the HDP oxide layer 208, which is the part not covered by the PR mask 210, is etched away. This etch back process can partially remove the HDP oxide film 208 and the remained HDP oxide 208a is easy to be polished away by CMP method.

However, the etch back process performed by the typical etch tool has a drawback that the etching rate is not uniform. The etch tool typically set as an in-side-out model or out-side-in model. The in-side-out model means that the etching rate in the center of the wafer is faster than in the two ends of the wafer. On the contrary, the out-side-in model means that the etching rate in the two ends of the wafer is faster than in the center of the wafer. Also, the deposition tool for forming the HDP oxide film has its structural limit, so that the deposited HDP oxide film close to the wafer's periphery is thinner than the wafer's center. If this uneven HDP oxide film is etched by an etch tool with out-side-in model, the thinner part of the oxide film (closed to the wafer's edge) will be quickly etched and become much thinner while the thicker part of the oxide film (closed to the wafer's center) will be slowly etched and maintain thicker, as shown in FIG. 2D.

The poor uniformity of the remained HDP oxide layer 208a causes the abnormal result in the CMP process of removing SIN layer, that is the over-thinner SIN around the wafer's edge. It not only increases the difficulty in controlling the SIN-removing process, but also causes stringer during SAMOS etch. The yield of the wafer is therefore affected.

SUMMARY OF THE INVENTION

It is therefore an object of the invention to provide a method of removing HDP oxide deposition mainly comprising two-step etching back process, so that the remaining HDP oxide has a better uniformity and can be completely removed.

The invention achieves the above-identified objects by providing a method of removing HDP oxide deposition, wherein a substrate having a silicon nitride layer formed thereon is provided, and further deposited a silicon oxide layer on the silicon nitride layer using high-density plasma (HDP), the method comprises the steps of: (1) etching the silicon oxide layer by in-side-out model, wherein the etching rate in the center of the substrate is faster than the edges of the substrate; (2) etching the silicon oxide layer by out-side-in model, wherein the etching rate in the edges of the substrate is faster than the center of the substrate; and (3) removing the remaining silicon oxide layer using chemical-mechanical polishing (CMP).

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
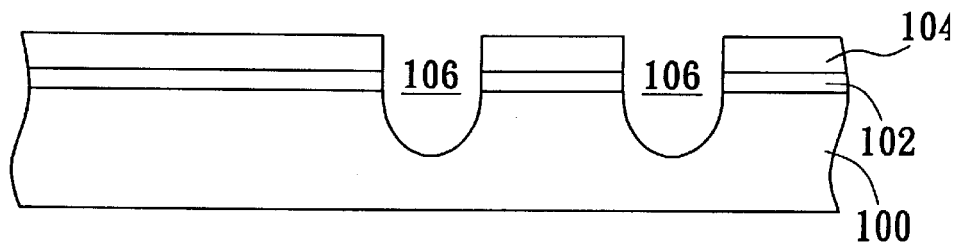
FIG. 1A~FIG. 1C (prior art) depict the cross-sectional view of a conventional process for forming a shallow trench isolation by chemical-mechanical polishing (CMP)
Figure 1B:
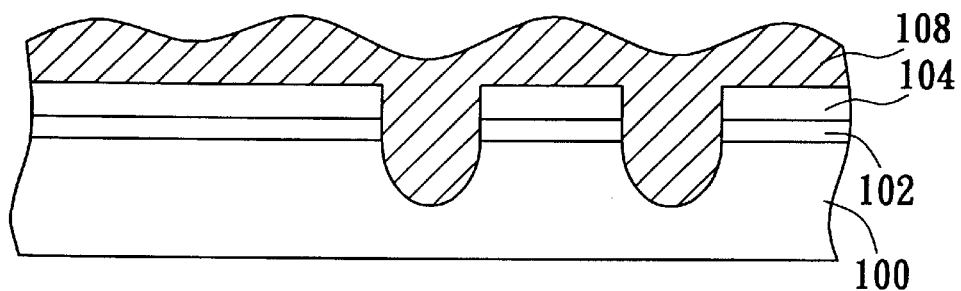
Figure 1C:
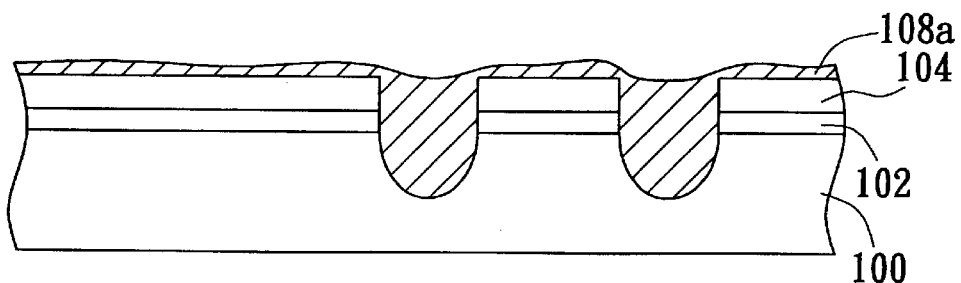
Figure 2A:
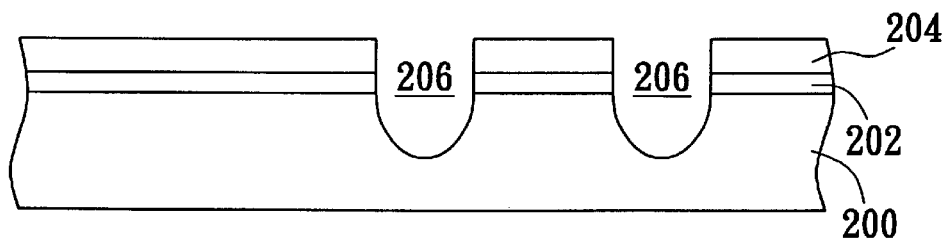
FIG. 2A~FIG. 2D (prior art) depict the cross-sectional view of another conventional process for forming a shallow trench isolation.
Figure 2B:
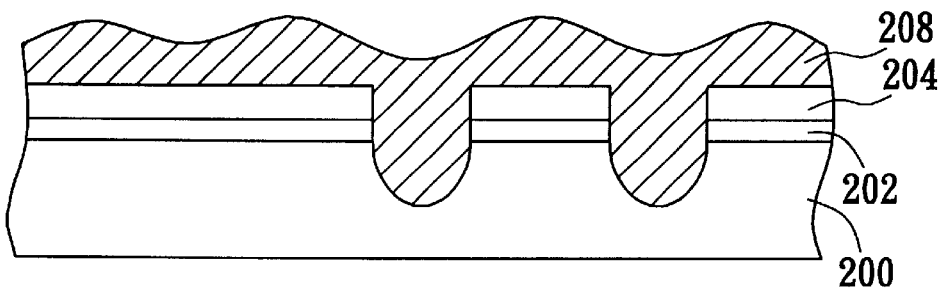
Figure 2C:
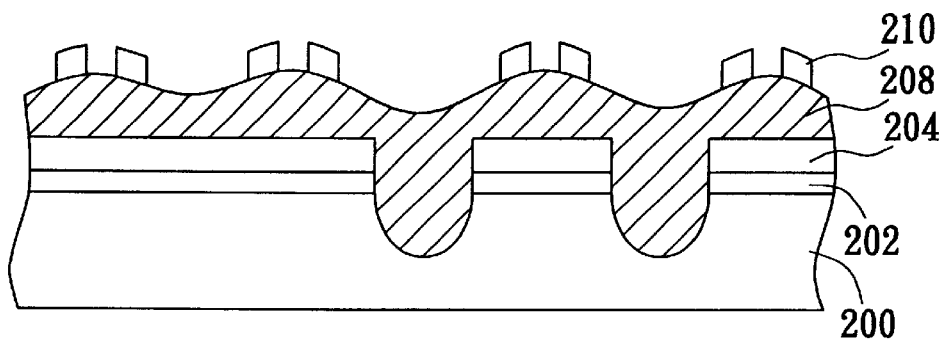
Figure 2D:
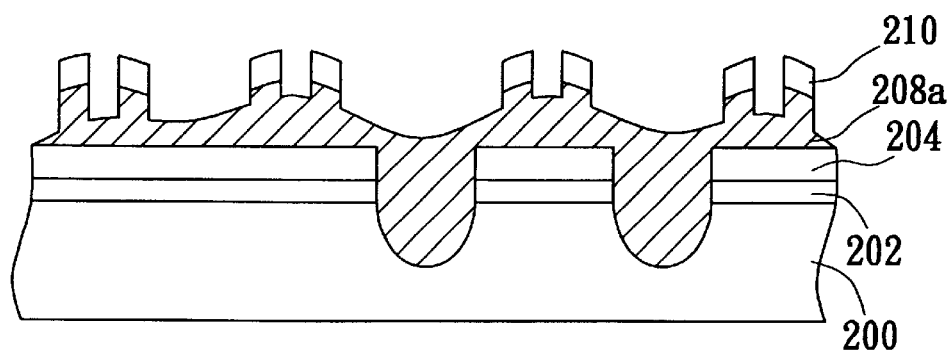

In the present invention, two-step etch back process approach is conducted to obtain the good uniformity (U%). To compensate the undulating oxide film deposited by high-density plasma (HDP) method, the oxide film is etched in accordance with in-side-out model, and followed by out-side-in model. The details of the invention are described below.

In the following description, a process for forming the shallow trench isolation in a semiconductor device is taken as an example. However, the process of the invention is not limited hereto but can be applied in the removal of HDP oxide deposition. Also, to avoid obscuring the invention, well-known elements not directly relevant to the invention are not shown or described. Accordingly, the specification and the drawing are to be regard as an illustrative sense rather than a restrictive sense.

Figure 3A:
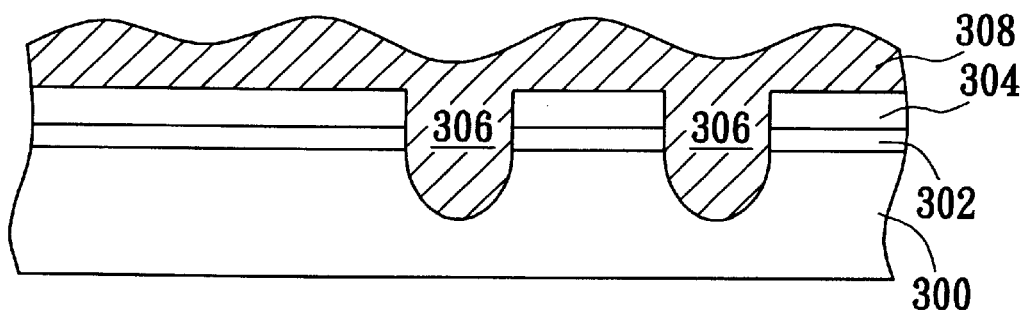
FIG. 3A~FIG. 3F depict the cross-sectional view of the process for forming a shallow trench isolation according to the invention.
Figure 3B:
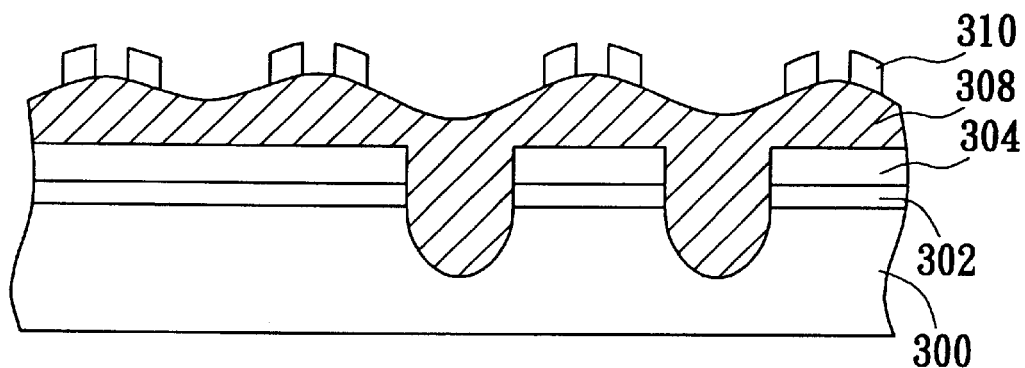

FIG. 3A~FIG. 3F depict the cross-sectional view of the process for forming a shallow trench isolation according to the invention. In FIG. 3A, a bottom oxide layer 302 and a silicon nitride (SIN) layer 304 are deposited on the substrate 300. Using photolithography, the bottom oxide layer 302, the SIN layer 304, and part of the substrate 300 are defined to form the shallow trench 306. Then, a silicon oxide (SIO2) layer is deposited over the SIN layer 304 using high-density plasma (HDP) method, and named HDP oxide layer 308. The HDP oxide layer 308 is about 8 K (8000 Å) thick and the deposited surface is undulating. Also, the HDP oxide layer 308 fills the shallow trench 306. In FIG. 3B, a photo-resist (PR) coated on the HDP oxide layer 308 is defined to be a PR mask 310 using photolithography.

Figure 3C:
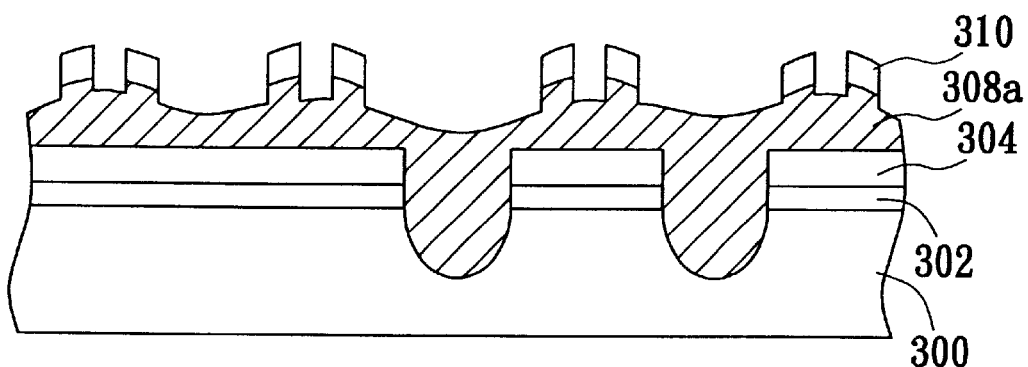

In FIG. 3C, the HDP oxide layer 308 is etched according to in-side-out model. The in-side-out model means that the etching rate in the center of the wafer is faster than in the edges of the wafer. The exposed part of the HDP oxide layer 308, which is the part not covered by the PR mask 310, is etched away. The remaining oxide layer on the SIN layer 304 is denoted as HDP oxide layer 308a.

Figure 3D:
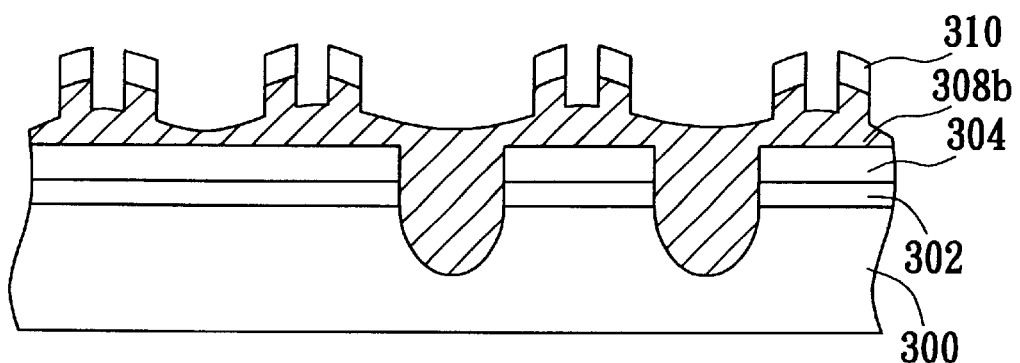

In FIG. 3D, the HDP oxide layer 308a is further etched according to out-side-in model. The out-side-in model means that the etching rate in the edge of the wafer is faster than in the center of the wafer. The exposed part of the HDP oxide layer 308a, which is the part not covered by the PR mask 310, is etched away. The remaining oxide layer on the SIN layer 304 is denoted as HDP oxide layer 308b.

Figure 3E:
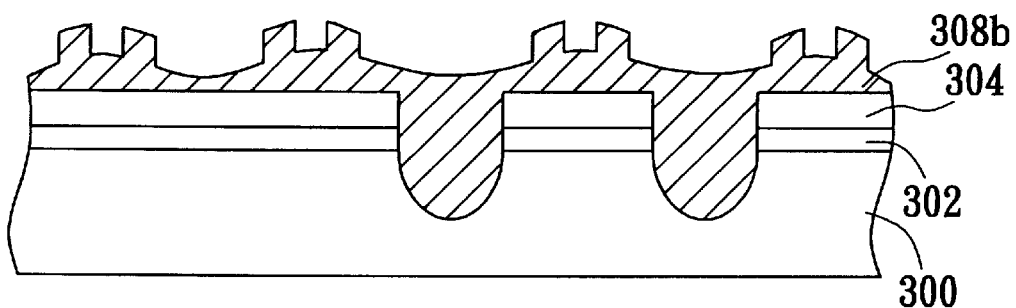

In FIG. 3E, the PR mask 310 is removed. Compared to the originally deposited HDP oxide layer 308, the profile of the HDP oxide layer 308b shows the smaller oxide segments and the more even thickness.

Figure 3F:
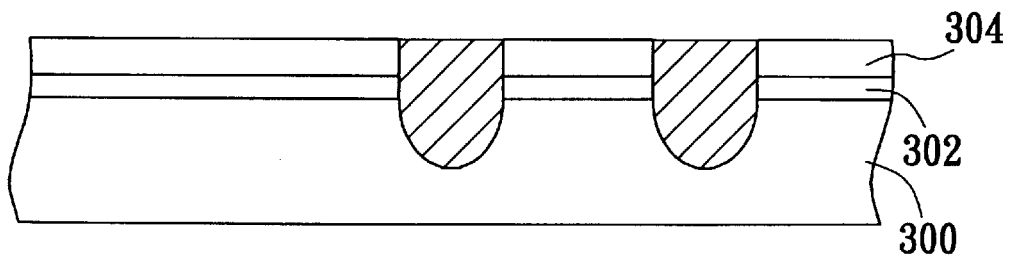

In FIG. 3F, the HDP oxide layer 308b is removed using chemical-mechanical polishing (CMP) method. The shallow trench isolation is thus obtained.

According to the aforementioned description, two-step etching process is applied in the invention, and the advantages of the invention include:

(1) The undulating HDP oxide deposition is etched first by in-side-out model followed by out-side-in model. This two-step etching process is able to compensate the HDP oxide deposition for the unevenness, and the remained HDP oxide has a better uniformity.

(2) The thick HDP oxide deposition is etched twice and become much thinner, so that the remained HDP oxide is easy to be polished away and no residue occurs.

While the invention has been described by ways of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of removing HDP oxide deposition, wherein a substrate having a silicon nitride layer formed thereon is provided, and further deposited a silicon oxide layer on the silicon nitride layer using high-density plasma (HDP), comprising the steps of:
   etching the silicon oxide layer by in-side-out model, wherein the etching rate in the center of the substrate is faster than the edges of the substrate;
   etching the silicon oxide layer by out-side-in model, wherein the etching rate in the edges of the substrate is faster than the center of the substrate; and
   removing the remaining silicon oxide layer.

2. The method of removing HDP oxide deposition according to claim 1, wherein the silicon oxide layer deposited by HDP method is about 8000 Å thick.

3. The method of removing HDP oxide deposition according to claim 1, wherein a bottom oxide layer is further formed between the substrate and the silicon oxide layer.

4. The method of removing HDP oxide deposition according to claim 1, wherein the remaining silicon oxide layer is removed by chemical-mechanical polishing.

5. A method of removing HDP oxide deposition, comprising the steps of:
   providing a substrate, and a silicon nitride layer is formed thereon;
   defining a plurality of shallow trenches on the substrate;
   forming a silicon oxide layer on the silicon nitride layer using high-density plasma (HDP), and the shallow trenches is filled with silicon oxide;
   etching the silicon oxide layer by in-side-out model, wherein the etching rate in the center of the substrate is faster than the edges of the substrate;
   etching the silicon oxide layer by out-side-in model, wherein the etching rate in the edges of the substrate is faster than the center of the substrate; and
   planarizing the remaining silicon oxide layer until silicon oxide filled the shallow trenches reach the same level as the silicon nitride layer.

6. The method of removing HDP oxide deposition according to claim 5, wherein a bottom oxide layer is further formed between the substrate and the silicon oxide layer.

7. The method of removing HDP oxide deposition according to claim 5, wherein the silicon oxide layer deposited by HDP method is about 8000 Å thick.

8. The method of removing HDP oxide deposition according to claim 5, wherein the remaining silicon oxide layer is removed by chemical-mechanical polishing.

* * * * *